United States Patent
Zhang et al.

(10) Patent No.: US 8,796,826 B2
(45) Date of Patent: Aug. 5, 2014

(54) WINDOW CLAMP TOP PLATE FOR INTEGRATED CIRCUIT PACKAGING

(75) Inventors: Xueren Zhang, Singapore (SG);
Kim-Yong Goh, Singapore (SG);
Wingshenq Wong, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 230 days.

(21) Appl. No.: 13/335,467

(22) Filed: Dec. 22, 2011

(65) Prior Publication Data

US 2013/0161806 A1    Jun. 27, 2013

(51) Int. Cl.
*H01L 23/495* (2006.01)
*H01L 21/44* (2006.01)
*B23K 31/02* (2006.01)
*B23K 37/04* (2006.01)

(52) U.S. Cl.
USPC ........... 257/666; 257/668; 257/674; 257/676; 257/726; 257/727; 257/E21.519; 257/E23.031; 257/E23.037; 257/E23.039; 228/4.5; 228/44.7; 228/180.5; 438/123

(58) Field of Classification Search
USPC .............. 257/666, 668, 674, 676, 726, 727, 257/E21.519, E23.031, E23.037, E23.039; 228/4.5, 44.7, 180.5; 438/123
See application file for complete search history.

(56) References Cited

U.S. PATENT DOCUMENTS

| | | | |
|---|---|---|---|
| 6,068,180 A * | 5/2000 | Test | 228/180.5 |
| 6,121,674 A * | 9/2000 | Corisis | 257/676 |
| 6,288,441 B1 * | 9/2001 | Corisis | 257/676 |
| 7,131,568 B2 * | 11/2006 | Ball | 228/180.5 |
| 7,777,353 B2 * | 8/2010 | Ohkawa | 257/784 |
| 7,847,392 B1 * | 12/2010 | Choi et al. | 257/696 |
| 2002/0048846 A1 * | 4/2002 | Corisis | 438/107 |
| 2008/0036051 A1 * | 2/2008 | Espiritu et al. | 257/666 |
| 2009/0243058 A1 * | 10/2009 | Shirasaka | 257/670 |
| 2013/0019458 A1 * | 1/2013 | Byars et al. | 29/559 |

FOREIGN PATENT DOCUMENTS

JP    03-084941    10/1991

* cited by examiner

*Primary Examiner* — Dao H Nguyen
(74) *Attorney, Agent, or Firm* — Graybeal Jackson LLP

(57) ABSTRACT

A device and method for minimizing the forces that may compromise a lead frame mount to a support structure in an integrated circuit die package during various packaging method steps. When a window clamp is used to provide pressure during a lead frame bonding step or during a wire bonding step during packaging, the vertical force applied by the window clamp may be transferred in lateral direction by the physical contour of the top plate of the support structure. By changing the physical contour of the top plate of the support structure, such as by disposing a specific kind of contoured protrusion, one may minimize or eliminate the lateral forces that act against achieving a solid bond of the lead frame to the support structure. Further, during wire bonding, the same minimization or elimination of lateral forces lead to improved wire bonding.

29 Claims, 3 Drawing Sheets

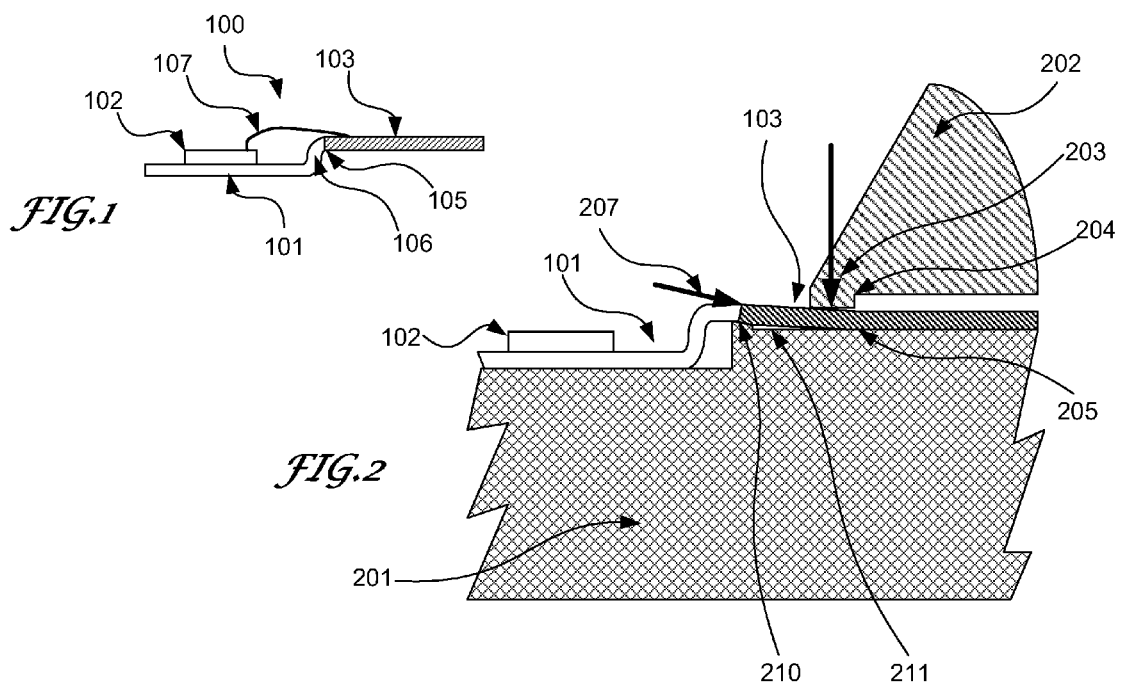
FIG.1
FIG.2
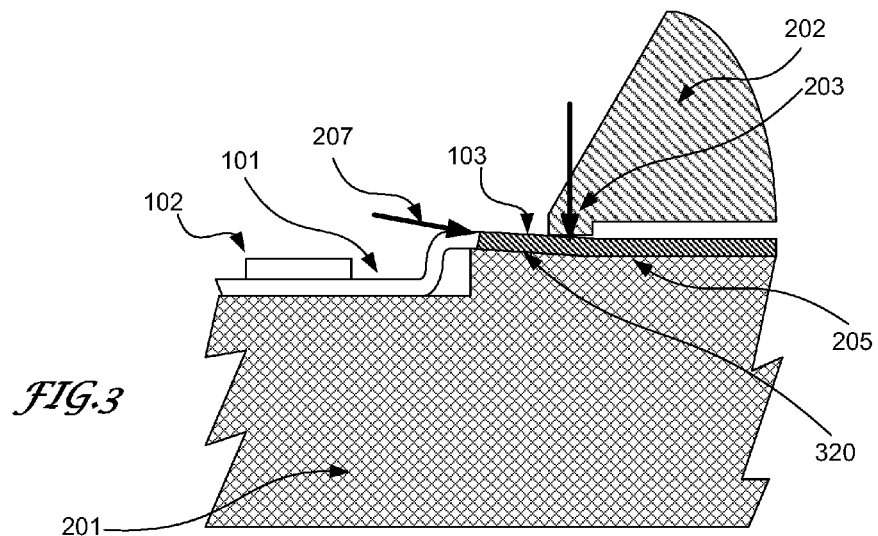
FIG.3

WINDOW CLAMP TOP PLATE FOR INTEGRATED CIRCUIT PACKAGING

BACKGROUND

Integrated circuit (IC) dies are commonly mounted in a package suitable to provide protection and optimal conditions for operation. Packaging (sometimes called encapsulation or sealing) involves mounting the die on a support structure such as a bed of a lead frame, connecting the die pads to interconnecting pins on the package via wires during a wire bonding step, and sealing the die. Tiny wires may be used to connect pads to the pins and these are commonly made from gold or copper. The lead frame may be made of copper and be plated with solder, a mixture of tin and lead. The lead frame is designed to provide a suitable mounting location for the die as well as provide a suitable mounting location for an interconnection landing point for wires during wire bonding.

Wire bonding is a common method of making interconnections between an IC and a package during semiconductor device fabrication. Wire bonding is generally considered the most cost-effective and flexible interconnect technology, and is used to assemble the vast majority of semiconductor packages. As such, it becomes important to assure that the lead frame (including the pad and leads) is securely attached to the support structure. If the lead frame mount is compromised, the die and lead frame tandem may be loose which will compromise the wire bonding procedure as well as increase the chance of the lead frame being compromised after sealing if the package is jostled or impacted.

BRIEF DESCRIPTION OF THE DRAWINGS

The foregoing aspects and many of the attendant advantages of the claims will become more readily appreciated as the same become better understood by reference to the following detailed description, when taken in conjunction with the accompanying drawings, wherein:

FIG. 1 shows a diagram of a lead frame with an integrated circuit die attached thereto.

FIG. 2 shows a diagram of a lead frame engaged with a support structure having a raised step that shows clamping forces acting against obtaining a solid mount.

FIG. 3 shows a diagram of a lead frame engaged with a support structure having an outwardly facing top plate angle that shows clamping forces acting against obtaining a solid mount.

DETAILED DESCRIPTION

Figure 4:
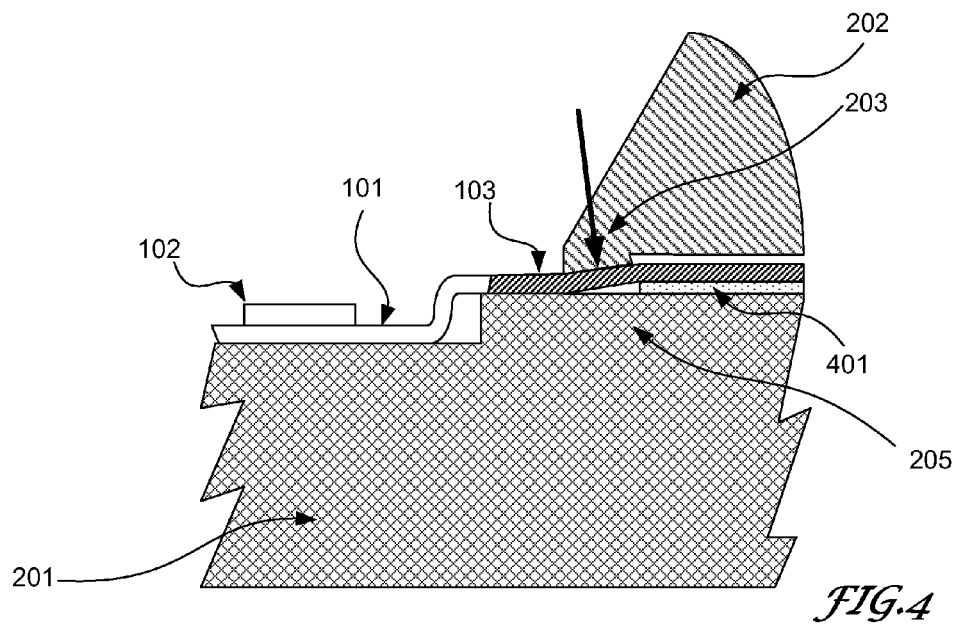
FIG. 4 shows a diagram of a lead frame engaged with a support structure having a mid-top-plate step according to an embodiment of the subject matter discussed herein.

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a device and method for minimizing the forces that may compromise a lead frame mount to a support structure in an integrated circuit die package during various packaging method steps. When a window clamp is used to provide pressure during a lead frame bonding step or during a wire bonding step during packaging, the vertical force applied by a window clamp may be transferred in lateral direction by the physical contour of the top plate of the support structure. By changing the physical contour of the top plate of the support structure, such as by disposing a specific kind of contoured protrusion, one may minimize or eliminate the lateral forces that act against achieving or maintaining a solid bond of the lead frame to the support structure. Further, during wire bonding, the same minimization or elimination of lateral forces lead to improved wire bonding as well as maintaining the solid bond between the lead frame and the support structure.

Thus, in one embodiment, the top plate of the support structure may include a step protrusion that is wide and disposed on an outer portion of the top plate. In another embodiment, the top plate may include one or more angled surfaces that are inwardly facing. With these top plate contours, the clamping force from the window clamp is focused to the vertical component and any lateral force components of the clamping force are reduced or rendered insignificant. These and other aspects of the subject matter discussed herein are described in greater detail below with respect to FIGS. 1-6.

FIG. 1 shows a diagram of a lead frame assembly 100 with an integrated circuit die 102 attached thereto. In this diagram, a lead frame assembly 100 includes a portion, commonly referred to as the lead 103, attached to a die pad 101. The attachment portion 106 may typically include a displacement such that the die pad 101 sits lower than the lead 103 and is coupled to the lead 103 at its lead tip 105 through this multi-angled attachment portion 106. As shown in the embodiment of FIG. 1, the attachment portion 106 comprises two ninety degree turns such that an elongated portion of the lead 103 is parallel with the elongated portion of the die pad 101. In this manner, an integrated circuit die 102 may be placed in the die pad 101 space while the lead 103 may curve upwards to rest upon a support structure of a wire bonding machine (not shown in this figure). Lastly, a wire 107 is shown bonded first to a bond pad on the die 102 and then second to a lead 103.

As is understood by those skilled in this art, the diagram of FIG. 1 shows one half of this embodiment of the lead frame assembly 100 as the left side of the lead frame assembly (which includes another lead tip (not shown) attached to another upper-elongated portion of the lead 103. Further, those skilled in the art understand that many leads 103 may be attached to a single die pad 101. For ease of illustration, only one half of the assembly 100 and only one lead 103 will be shown and discussed below.

By including this multi-angled lead tip 105 and attachment portion 106, when a window clamp is used to apply a downward force on the lead 103, the lead tip 105 tends to flex slightly such that the die pad 101 remains stationary. By remaining stationary, the integrated circuit die 102 may be shielded from stresses and other forces during packaging and other production steps. Further, both the bond between the wire 107 and the die 102 as well as the bond between the wire 107 and the lead 103 may also be protected. These and other external forces are discussed below with respect to the various manners in which the lead frame assembly 100 may be manipulated when on a support structure of a wire bonding machine. Further, the various support structure designs may also account for variable lead frame planarity or longer clamping force to lead tip distance.

FIG. 2 shows a diagram of a lead frame assembly 100 engaged with a support structure 201 having a raised step 210 that shows clamping forces acting against maintaining a solid wire bond. In this diagram, one can see the lead frame assembly 100 of FIG. 1 engaged with a support structure 201 during a manufacturing step such that a window clamp 202 is applying a downward force 203. As is common, the window clamp 202 applies a downward force 203 at a clamping edge 204 that is in contact with the lead 103. This downward force 203, when applied under suitable temperature and pressure condition will compress the lead 103 to the top plate 205 of the support structure 201.

Maintaining the solid wire bond in both locations is desired here for assuring electrical connections as well as keeping the lead frame assembly 100 from moving about within the packaging. As such, different top plate 205 designs may be implemented to assist with obtaining a solid bond between the wire (not shown further for ease of illustration) and the lead 103. In this design, the top plate 205 of FIG. 2 includes a raised step 210 at the inside edge of the top plate and the rest of the support structure 201. Then, when the window clamp 202 applies the downward pressure on the lead 103, the lead tip 105 of the lead frame assembly 100 allows the lead 103 to bend downward as well. As the lead 103 bends downward however, a cavity 211 is formed between the lead 103 and the top plate 205. Thus, the raised step 210 provides for a better opportunity to maintain the wire bond, but there still remains at least some force 207 in a lateral direction that tends to work against maintaining a solid wire bond. That is, when the downward force 203 is applied, a majority of the force is transferred in the same vertical direction to result in the downward bonding force 203. The raised step 210, however, causes the lead tip 105 to flex enough such that the lead frame assembly 100 pulls slightly toward the interior of the support 201 as shown by force 207. As a result, the bond between the wire and the lead 103 is compromised as the lateral force 207 still works against this bond. Furthermore, because of the cavity 211, when wires are bonded to the lead frame 103, additional flexing may weaken the initial wire on the lead 103 bond further. Further yet, as the clamping edge 204 of the window clamp 202 is further away from the lead tip 105, additional lateral force also results as the lateral force 207 working against the bond is increased because of the increased leverage.

FIG. 3 shows a diagram of a lead 103 engaged with a support structure 201 having an outwardly facing top plate angle 320 that shows clamping forces acting against maintaining solid wire bonding. In this diagram, one can again see the lead frame assembly 100 of FIG. 1 engaged with a support structure 201 during a manufacturing step such that a window clamp 202 is applying a downward force 203.

Figure 5:
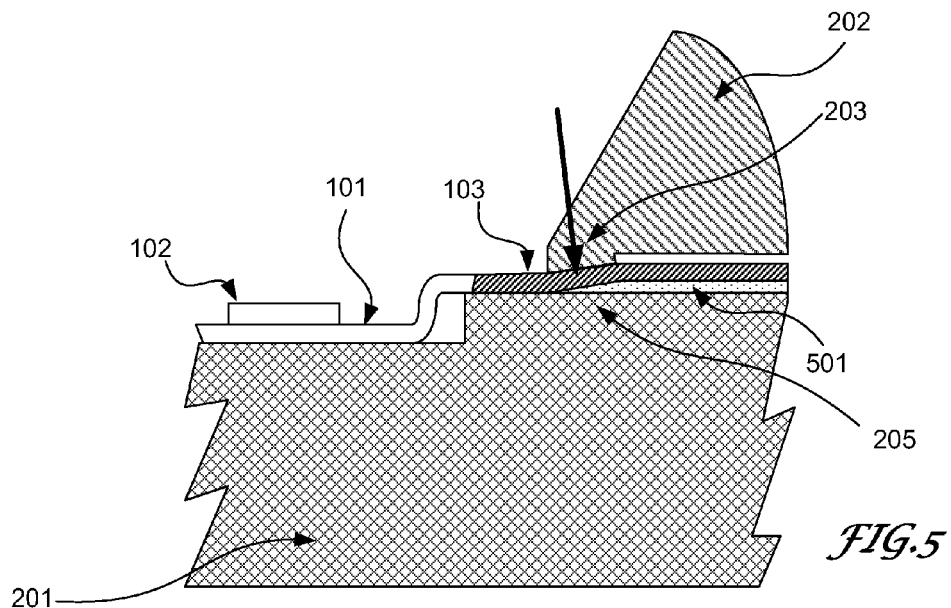
FIG. 5 shows a diagram of a lead frame engaged with a support structure having an inwardly facing angle according to an embodiment of the subject matter discussed herein.
Figure 6:
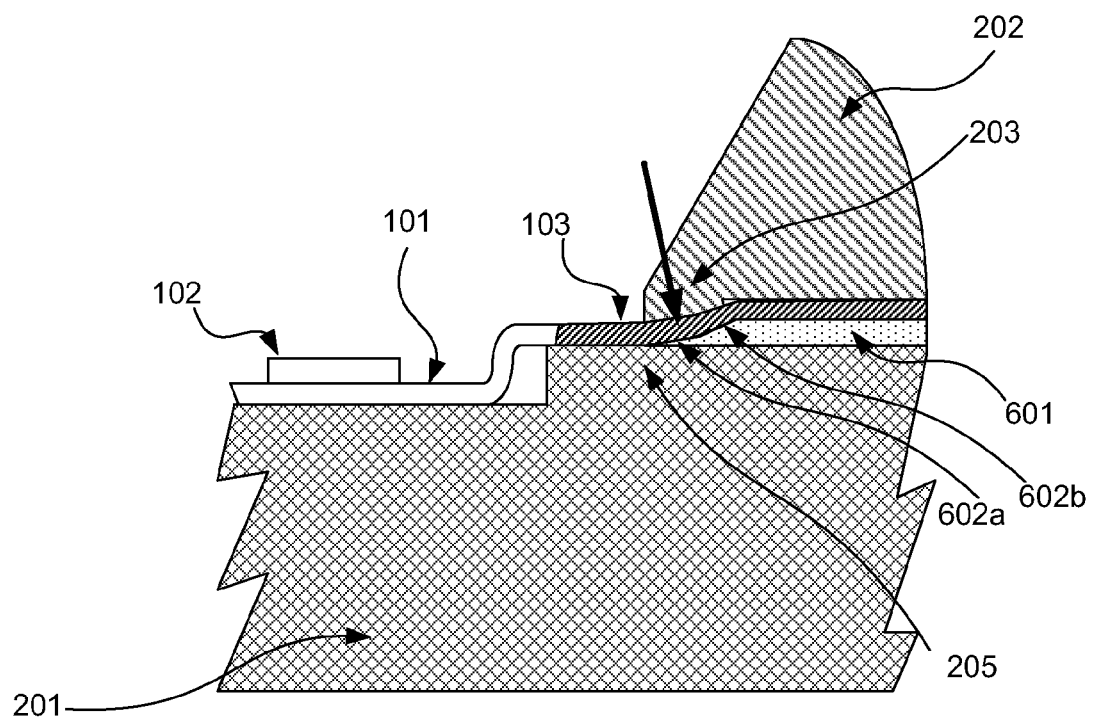
FIG. 6 shows a diagram of a lead frame engaged with a support structure having multiple inwardly facing angles according to an embodiment of the subject matter discussed herein.

In this design, the top plate 205 of FIG. 3 includes a n outwardly facing top plate angle 320 starting at the inside edge of the top plate 205 near the lead tip 105. Here, when the window clamp 202 applies the downward force 203 on the lead 103, the lead tip 105 of the lead frame assembly 100 again allows the lead 103 to bend downward as well. Thus, the top plate angle 320 also provides for a better opportunity to maintain the bond between the lead 103 and the wire, but there still remains at least some force 207 in a lateral direction that tends to work against maintaining a solid bond. When the downward force 203 is applied, a majority of the force is transferred in the same vertical direction to result in the downward force 203. The top plate angle 320, however, causes the lead tip 105 to again flex enough such that the lead frame assembly 100 pulls slightly toward the interior of the support 201 as shown by force 207. As a result, the wire bond between the wire and the lead 103 may be slightly compromised. By eliminating the lateral force 207 during this clamping operation, a better chance for maintaining a solid bond is obtained. FIGS. 4-6 below show top plate 205 designs that neutralize this lateral force 207.

FIG. 4 shows a diagram of a lead 103 engaged with a support structure 201 having a mid-top-plate step 401 according to an embodiment of the subject matter discussed herein. In this diagram, one can now see the lead frame assembly 100 engaged with a support structure 201 during a manufacturing step such that a window clamp 202 is applying a downward force 203 directly at the step 401.

In this design, the top plate 205 of FIG. 4 includes a raised step 401 that has its first edge at a mid-point along the top plate 205. Then, the raised step 401 remains at this level until reaching the end of the support structure 201 on its outer edge. Thus, the raised mid-point step 401 is some distance from the lead tip 105. Now, when the window clamp 202 applies the downward force 203 on the lead 103, the lead tip 105 of the lead frame assembly 100 again allows the lead 103 to bend inward to conform to the mid-point raised step 401 contour. In this manner, because the force 203 is applied orthogonal to the angle created by the non-raised area of the top plate 205 and the raised step 401 area of the top plate 205, there is no other meaningful force in either lateral direction that works against the wire bond of the lead 103. By changing the raised step support design from under lead tip 105 to a mid-point under window clamp 202, the bonding force on lead 103 is orthogonally applied, thus there is no tendency (e.g., lateral force) to move the lead 103, resulting in a maintained wire bond quality.

The raised step 401 may be approximately 25 um above the non-raised portion of the top plate 205. This difference may result is an angle when the lead 103 is mounted of approximately 2°, In other embodiments, this angle may range from 1° to 10°, depending on optimization with regard to the length of the lead 103. Further, the window clamp 202 head may also have a reciprocal matching angle, but such a window clamp 202 with a matching angle is not necessary to maintain the wire bond quality.

FIG. 5 shows a diagram of a lead 103 engaged with a support structure 201 having an inwardly facing angle 501 according to an embodiment of the subject matter discussed herein. In this diagram, much like FIG. 4, one can now see the lead frame assembly 100 engaged with a support structure 201 during a manufacturing step such that a window clamp 202 is applying a downward force 203 directly at the inwardly facing angle 501.

In this design, the top plate 205 of FIG. 5 includes an inwardly facing angle 501 starting at a mid-point along the top plate 205. Then, at another mid-point along the top plate 205, the angled section ends and the top plate 205 returns to a flat section parallel with the initial non-angled section but raised up a few nanometers. Thus, as was the case with the embodiment of FIG. 4, the angled section 501 is some distance from the lead tip 105. Again, when the window clamp 202 applies the downward force 203 on the lead 103, the lead tip 105 of the lead frame assembly 100 again allows the lead 103 to bend inward to conform to the angled contour. As before, because the force 203 is applied orthogonal to the angle of the angled section 501, there is no other meaningful force in either lateral direction that works against maintaining a solid wire bond of the lead 103.

The angle of angled portion 501 may be approximately 2°. In other embodiments, this angle may range from 1° to 10°, depending on optimization with regard to the length of the lead frame 103. Further, the window clamp 202 head may also have a reciprocal matching angle as discussed above. Further yet, the angled portion 501 may comprise more than one angled section and at different angles. Such an embodiment is described further with respect to FIG. 6 below.

FIG. 6 shows a diagram of a lead 103 engaged with a support structure 201 having multiple inwardly facing angles according to an embodiment of the subject matter discussed herein. In this diagram, much like FIGS. 4 and 5, one can now see the lead frame assembly 100 engaged with a support structure 201 during a manufacturing step such that a window clamp 202 is applying a downward force 203 directly at the angled section 601.

In this design, the top plate 205 of FIG. 6 includes a mid-section that comprises multiple inwardly facing angles 602a and 602b starting at a mid-point along the top plate 205. Then, at another mid-point along the top plate 205, the angled section ends and the top plate 205 returns to a flat section parallel with the initial non-angled section. The multi-angled section 601 is some distance from the lead tip 105. Again, when the window clamp 202 applies the downward force 203 on the lead 103, the lead tip 105 of the lead frame assembly 100 again allows the lead 103 to bend inward to conform to the multi-angled contour. As before, because the force 203 is applied substantially orthogonal to the angle created by the multi-angled area 601 of the top plate 205, there is no other meaningful force in either lateral direction.

The angle of first angled portion 602a may be approximately 2° and the next angle of the second angled section 602b may be an additional 2° resulting in 4° from the original flat section of the top plate 205. In other embodiments, these angles may each range from 1° to 10°, such that the overall total angular disposition also ranges from 1° to 10°. As before, the window clamp 202 head may also have reciprocal matching angles. Further yet, more than two angles may be present in the multi-angled section 601.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A support structure for a lead frame assembly, comprising:
    a top plate configured to support a lead of a lead frame; and
    a contoured protrusion disposed over the top plate, the protrusion having a shape that reduces lateral forces of a vertical force applied to the lead at the contoured protrusion.

2. The support structure of claim 1, wherein the contoured protrusion comprises a step at a mid-point of the top plate.

3. The support structure of claim 2, wherein the step comprises a step up from an initial top-plate level.

4. The support structure of claim 1, wherein the contoured protrusion comprises an angled surface.

5. The support structure of claim 4, wherein the angled surface comprises and angle of approximately 2°.

6. The support structure of claim 4, wherein the angled surface comprises and angle between 1° and 10°.

7. The support structure of claim 1, wherein the contoured protrusion comprises a multi-angled surface.

8. The support structure of claim 7, wherein the multi-angled surface comprises:
    a first section having a first angle with respect to a non-angled section of the surface; and
    a second section having a second angle with respect to the first section.

9. The support structure of claim 8, wherein the first angle is the same as the second angle.

10. The support structure of claim 8, wherein the second section is disposed at an angle with respect to the non-angled section of the top plate that is greater than the angle of the first section with respect to the non-angled section.

11. The support structure of claim 7, wherein the multi-angled surface comprises:
    a first section having a first angle with respect to a non-angled section of the surface;
    a second section having a second angle with respect to the first section; and
    a third section having a third angle with respect to the first section.

12. The support structure of claim 1, wherein the contoured protrusion comprises:
    a first section having a first level; and
    a second section that is at a second level that is different from the first level.

13. An integrated circuit packaging system, comprising:
    a support structure for hosting a lead frame assembly, the support structure including:
        a top plate configured to support the lead frame assembly; and
        a contoured protrusion disposed over the top plate, the protrusion having a shape that reduces lateral forces of a vertical clamping force applied to the lead frame assembly at the contoured protrusion;
    a lead frame assembly having an integrated circuit die disposed on the lead frame assembly; and
    a window clamp configured to apply the vertical force to the lead frame assembly.

14. The integrated circuit packaging system of claim 13, wherein the lead frame assembly further comprises:
    a die pad configured to hold the integrated circuit die;
    a lead configured to engage the top plate of the support structure; and
    a lead tip coupling the die pad to the lead.

15. The integrated circuit packaging system of claim 13, wherein the contoured protrusion comprises a step at a mid-point of the top plate.

16. The integrated circuit packaging system of claim 13, wherein the contoured protrusion comprises an angled surface.

17. The integrated circuit packaging system of claim 16, wherein the angled surface comprises and angle of approximately 2°.

18. The integrated circuit packaging system of claim 13, wherein the contoured protrusion comprises a multi-angled surface.

19. The integrated circuit packaging system of claim 13, wherein the contoured protrusion comprises:
    a first section having a first level; and
    a second section that is at a second level that is different from the first level.

20. A window clamp, comprising:
    a clamping edge configured to apply a force to a lead of a lead frame assembly;
    wherein the clamping edge comprises a contour having a shape that reduces lateral forces of the force applied to the lead at the clamping edge.

21. The window clamp of claim 20, wherein the shape comprises an angled surface.

22. The window clamp of claim 21, wherein the angled surface comprises and angle of approximately 2°.

23. The window clamp of claim 21, wherein the angled surface comprises and angle between 1° and 10°.

24. The window clamp of claim 20, wherein, wherein the shape comprises a multi-angled surface.

25. A method, comprising:
   applying a clamping force to a lead in a first direction;
   absorbing at least some of the force from the clamping force with a contoured top plate of a support structure that is disposed under the lead such that forces in directions other than the first direction are substantially eliminated by the contour of the top plate.

26. The method of claim 25, wherein the clamping force is applied by a window clamp.

27. The method of claim 26, further comprising applying a clamping force at an angle orthogonal to an angle of the contour of the top plate.

28. The method of claim 25, wherein the clamping force is applied by a window clamp having a similar contour to the top plate.

29. The method of claim 25, further comprising disposing an integrated circuit die on a lead frame attached to the lead.

\* \* \* \* \*